US009423687B2

(12) United States Patent
Liao et al.

(10) Patent No.: US 9,423,687 B2
(45) Date of Patent: Aug. 23, 2016

(54) MASK PLATE, METHOD FOR FABRICATING ARRAY SUBSTRATE USING THE SAME, AND ARRAY SUBSTRATE

(71) Applicants: BOE Technology Group Co., Ltd., Beijing (CN); Beijing BOE Display Technology Co., Ltd., Beijing (CN)

(72) Inventors: Yanping Liao, Beijing (CN); Jing Lv, Beijing (CN); Xibin Shao, Beijing (CN); Daekeun Yoon, Beijing (CN); Ying Wang, Beijing (CN); Zhenyu Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 13/974,223

(22) Filed: Aug. 23, 2013

(65) Prior Publication Data

US 2014/0057082 A1 Feb. 27, 2014

(30) Foreign Application Priority Data

Aug. 24, 2012 (CN) .......................... 2012 1 0306678

(51) Int. Cl.
*G03C 5/06* (2006.01)
*G03F 7/00* (2006.01)
*G03F 1/00* (2012.01)

(52) U.S. Cl.
CPC .. *G03F 7/00* (2013.01); *G03F 1/00* (2013.01); *Y10T 428/2457* (2015.01)

(58) Field of Classification Search
CPC ........................................................ G03F 1/14
USPC .......................................... 430/394, 396, 397
See application file for complete search history.

(56) References Cited

U.S. PATENT DOCUMENTS 5,358,809 A * 10/1994 Van Berkel ........................ 430/6
5,684,547 A    11/1997 Park et al.
6,165,692 A * 12/2000 Kanai .......................... G03F 1/26
                                                              378/35

FOREIGN PATENT DOCUMENTS

CN 200986640 Y 12/2007
CN 201266288 Y 7/2009

OTHER PUBLICATIONS

First Office Action dated May 23, 2013 (most recent office action prior to the decision to grant a patent) issued by State Intellectual Property Office of the People's Republic of China in connection with Chinese counterpart application, Chinese National Application No. 20121036678.3.
English translation of First Office Action dated May 23, 2013 (most recent office action prior to the decision to grant a patent) issued by State Intellectual Property Office of the People's Republic of China in connection with Chinese counterpart application, Chinese National Application No. 20121036678.3.
Notification to Grant the Patent Right dated Oct. 24, 2013 issued by State Intellectual Property Office of the People's Republic of China in connection with Chinese counterpart application, Chinese National Application No. 20121036678.3.
English translation of Notification to Grant the Patent Right dated Oct. 24, 2013 issued by State Intellectual Property Office of the People's Republic of China in connection with Chinese counterpart application, Chinese National Application No. 20121036678.3.
English machine translation of Chinese Patent Document No. CN 200986640 Y (above), from machine translation feature of State Intellectual Property Office of the People's Republic of China.
English translation of Abstract of Chinese Patent Document No. CN 200986640 Y (above).
English machine translation of Chinese Patent Document No. CN 201266288 Y (above), from machine translation feature of State Intellectual Property Office of the People's Republic of China.
English translation of Abstract of Chinese Patent Document No. CN 201266288 Y (above).

* cited by examiner

*Primary Examiner* — Daborah Chacko Davis

(57) ABSTRACT

Embodiments of the invention provide a mask plate, a method for fabricating an array substrate using the mask plate, and an array substrate. The mask plate is used for fabricating the array substrate by a stitching exposure. The mask plate comprises 2n+1 mask patterns successively arranged and parallel to each other, where n is any natural number, each mask pattern includes a light-shielding pattern corresponding to a portion of a data signal line on the array substrate. The light-shielding patterns of two adjacent mask patterns are discontinuous, and the portions on both sides of the light-shielding pattern of the mask pattern located in the middle of the mask plate are asymmetric.

8 Claims, 3 Drawing Sheets

MASK PLATE, METHOD FOR FABRICATING ARRAY SUBSTRATE USING THE SAME, AND ARRAY SUBSTRATE

CROSS REFERENCE TO RELATED APPLICATIONS

This application claims priority from Chinese National Application No. 201210306678.3 filed on Aug. 24, 2012, the contents of which are incorporated herein by reference.

TECHNICAL FIELD

Embodiments of the invention relate to a mask plate, a method for fabricating an array substrate using the mask plate, and an array substrate.

BACKGROUND

When forming an array substrate of a conventional liquid crystal display panel, an array pattern of the array substrate is completely contained in a single mask plate. In the exposure process, the whole array pattern can be formed by a single exposure process, and such array pattern is consistent with the pattern of the mask plate.

In the array substrate formed as described above, data signal lines provided on the array substrate are continuous (as shown in FIG. 1). In this case, the liquid display panel comprising the array substrate can only input one data signal at one time, resulting in a lower image scanning frame rate of the liquid crystal display panel if the pixel charging time is kept constant, or a shorter pixel charging time if the image scanning frame rate of the liquid crystal display panel is kept constant.

SUMMARY

According to one aspect of the invention, a mask plate is provided. The mask plate is used for fabricating an array substrate by a stitching exposure. The mask plate comprises 2n+1 mask patterns successively arranged and parallel to each other, where n is any natural number, each mask pattern includes a light-shielding pattern corresponding to a portion of a data signal line on the array substrate. The light-shielding patterns of two adjacent mask patterns are discontinuous, and the portions on both sides of the light-shielding pattern of the mask pattern located in the middle of the mask plate are asymmetric.

For example, the mask plate comprises a first mask pattern, a second mask pattern and a third mask pattern successively arranged, and the portions on both sides of the light-shielding pattern of the second mask pattern are asymmetric.

According to another aspect of the invention, an array substrate is provided. The array substrate comprises 2m pattern regions successively arranged and parallel to each other, where m is any natural number, there exists a stitching region between two adjacent pattern regions, and a data signal line on the array substrate is disconnected in the stitching region between two adjacent pattern regions in the middle of the 2m pattern regions.

For example, the array substrate comprises a first pattern region, a second pattern region, a third pattern region and a fourth pattern region successively arranged, and the data signal line on the array substrate is disconnected in the stitching region between the second pattern region and the third pattern region.

For example, the array substrate is formed by a stitching exposure with a mask plate. The mask plate comprises 2n+1 mask patterns successively arranged and parallel to each other, where n is any natural number, each mask pattern includes a light-shielding pattern corresponding to a portion of the data signal line on the array substrate. The light-shielding patterns of two adjacent mask patterns are discontinuous, and the portions on both sides of the light-shielding pattern of the mask pattern located in the middle of the mask plate are asymmetric.

For example, the mask plate comprises a first mask pattern, a second mask pattern and a third mask pattern successively arranged, and the portions on both sides of the light-shielding pattern of the second mask pattern are asymmetric.

According to yet another aspect of the invention, a method for fabricating an array substrate using a mask plate is provided. The mask plate comprises 2n+1 mask patterns successively arranged and parallel to each other, where n is any natural number, each mask pattern includes a light-shielding pattern corresponding to a portion of a data signal line on the array substrate. The light-shielding patterns of two adjacent mask patterns are discontinuous, and the portions on both sides of the light-shielding pattern of the mask pattern located in the middle of the mask plate are asymmetric. The method for fabricating the array substrate including:

successively performing exposures for n times using the first n mask patterns to obtain n first pattern regions on the array substrate, so that the data signal line in each first pattern region is connected with the data signal line in the adjacent first pattern region;

performing an exposure using the $(n+1)^{th}$ mask pattern to obtain a second pattern region on the array substrate, so that the data signal line in the second pattern region is connected with the data signal line in the adjacent first pattern region;

performing an exposure using the $(n+1)^{th}$ mask pattern again to obtain a third pattern region on the array substrate, so that the data signal line in the third pattern region is disconnected with the data signal line in the second pattern region;

successively performing exposures for n times using $(n+2)^{th}$ to $(2n+1)^{th}$ mask patterns to obtain n fourth pattern regions on the array substrate, so that the data signal line in the third pattern region is connected with the data signal line in the adjacent fourth pattern region, and the data signal line in each fourth pattern region is connected with the data signal line in the adjacent fourth pattern region For example, the method includes:

step a: shielding the other 2n mask patterns and using a first mask pattern to perform an exposure;

step b: moving the mask plate, shielding the other 2n mask patterns and using a next mask pattern to perform an exposure;

step c: repeating the above step b until completing exposures for n times successively using the first n mask patterns to obtain the n first pattern regions on the array substrate, so that the data signal line in each first pattern region is connected with the data signal line in the adjacent first pattern region;

step d: moving the mask plate, shielding the other 2n mask patterns and using the $(n+1)^{th}$ mask pattern to perform the exposure to obtain the second pattern region on the array substrate, so that the data signal line in the second pattern region is connected with the data signal line in the adjacent first pattern region;

step e: moving the mask plate, shielding the other 2n mask patterns and using the $(n+1)^{th}$ mask pattern again to perform the exposure to obtain the third pattern region on the array substrate, so that the data signal line in the third pattern region is disconnected with the data signal line in the second pattern region;

step f: moving the mask plate, shielding the other 2n mask patterns and using the $(n+2)^{th}$ mask pattern to perform an exposure;

step g: moving the mask plate, shielding the other 2n mask patterns and using a next mask pattern to perform an exposure;

step h: repeating the above step g until completing exposures for n times successively using the $(n+2)^{th}$ to $(2n+1)^{th}$ mask patterns to obtain the n fourth pattern regions on the array substrate, so that the data signal line in the third pattern region is connected with the data signal line in the adjacent fourth pattern region, and the data signal line in each fourth pattern region is connected with the data signal line in the adjacent fourth pattern region.

For example, the mask plate comprises a first mask pattern, a second mask pattern and a third mask pattern successively arranged, and the portions on both sides of the light-shielding pattern of the second mask pattern are asymmetric. For example, the method includes:

a first exposure process: shielding the second mask pattern and the third mask pattern and using the first mask pattern to perform an exposure to obtain the first pattern region on the array substrate;

a second exposure process: moving the mask plate, shielding the first mask pattern and the third mask pattern and using the second mask pattern to perform an exposure to obtain the second pattern region on the array substrate, so that the data signal line in the second pattern region is connected with the data signal line in the first pattern region;

a third exposure process: moving the mask plate, shielding the first mask pattern and the third mask pattern and using the second mask pattern again to perform an exposure to obtain the third pattern region on the array substrate, so that the data signal line in the second pattern region is disconnected with the data signal line in the third pattern region;

a fourth exposure process: moving the mask plate, shielding the first mask pattern and the second mask pattern and using the third mask pattern to perform an exposure to obtain the fourth pattern region on the array substrate, so that the data signal line in the third pattern region is connected with the data line in the fourth pattern region.

DETAILED DESCRIPTION

Figure 1:
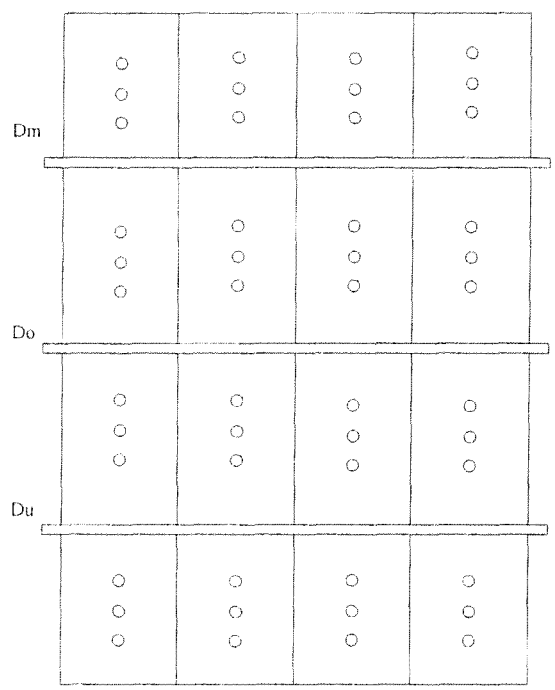
FIG. 1 is a schematic diagram illustrating distribution of data signal lines on a conventional array substrate.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

According to an embodiment of the invention, a mask plate is provided. The mask plate is used for fabricating an array substrate by a stitching exposure. The mask plate comprises 2n+1 mask patterns successively arranged and parallel to each other, where n is any natural number, each mask pattern includes a light-shielding pattern corresponding to a portion of a data signal line on the array substrate. The light-shielding patterns of two adjacent mask patterns are discontinuous, and the portions on both sides of the light-shielding pattern of the mask pattern located in the middle of the mask plate are asymmetric.

For example, the mask plate comprises a first mask pattern, a second mask pattern and a third mask pattern successively arranged, and the portions on both sides of the light-shielding pattern of the second mask pattern are asymmetric.

According to another embodiment of the invention, an array substrate is provided. The array substrate comprises 2m pattern regions successively arranged and parallel to each other, where m is any natural number, there exists a stitching region between two adjacent pattern regions, and a data signal line on the array substrate is disconnected in the stitching region between two adjacent pattern regions in the middle of the 2m pattern mask.

For example, the array substrate comprises a first pattern region, a second pattern region, a third pattern region and a fourth pattern region successively arranged, and the data signal line on the array substrate is disconnected in the stitching region between the second pattern region and the third pattern region.

For example, the array substrate is formed by a stitching exposure with a mask plate. The mask plate comprises 2n+1 mask patterns successively arranged and parallel to each other, where n is any natural number, each mask pattern includes a light-shielding pattern corresponding to a portion of the data signal line on the array substrate. The light-shielding patterns of two adjacent mask patterns are discontinuous, and the portions on both sides of the light-shielding pattern of the mask pattern located in the middle of the mask plate are asymmetric.

For example, the mask plate comprises a first mask pattern, a second mask pattern and a third mask pattern successively arranged, and the portions on both sides of the light-shielding pattern of the second mask pattern are asymmetric.

According to yet another embodiment of the invention, a method for fabricating an array substrate using a mask plate is provided. The mask plate comprises 2n+1 mask patterns successively arranged and parallel to each other, where n is any natural number, each mask pattern includes a light-shielding pattern corresponding to a portion of a data signal line on the array substrate. The light-shielding patterns of two adjacent mask patterns are discontinuous, and the portions on both sides of the light-shielding pattern of the mask pattern located in the middle of the mask plate are asymmetric. The method for fabricating the array substrate including:

successively performing exposures for n times using the first n mask patterns to obtain n first pattern regions on the array substrate, so that the data signal line in each first pattern region is connected with the data signal line in the adjacent first pattern region;

performing an exposure using the $(n+1)^{th}$ mask pattern to obtain a second pattern region on the array substrate, so that the data signal line in the second pattern region is connected with the data signal line in the adjacent first pattern region;

performing an exposure using the $(n+1)^{th}$ mask pattern again to obtain a third pattern region on the array substrate, so that the data signal line in the third pattern region is disconnected with the data signal line in the second pattern region;

successively performing exposures for n times using $(n+2)^{th}$ to $(2n+1)^{th}$ mask patterns to obtain n fourth pattern regions on the array substrate, so that the data signal line in the third pattern region is connected with the data signal line in the adjacent fourth pattern region, and the data signal line in each fourth pattern region is connected with the data signal line in the adjacent fourth pattern region For example, the method includes:

step a: shielding the other 2n mask patterns and using a first mask pattern to perform an exposure;

step b: moving the mask plate, shielding the other 2n mask patterns and using a next mask pattern to perform an exposure;

step c: repeating the above step b until completing exposures for n times successively using the first n mask patterns to obtain the n first pattern regions on the array substrate, so that the data signal line in each first pattern region is connected with the data signal line in the adjacent first pattern region;

step d: moving the mask plate, shielding the other 2n mask patterns and using the $(n+1)^{th}$ mask pattern to perform the exposure to obtain the second pattern region on the array substrate, so that the data signal line in the second pattern region is connected with the data signal line in the adjacent first pattern region;

step e: moving the mask plate, shielding the other 2n mask patterns and using the $(n+1)^{th}$ mask pattern again to perform the exposure to obtain the third pattern region on the array substrate, so that the data signal line in the third pattern region is disconnected with the data signal line in the second pattern region;

step f: moving the mask plate, shielding the other 2n mask patterns and using the $(n+2)^{th}$ mask pattern to perform an exposure;

step g: moving the mask plate, shielding the other 2n mask patterns and using a next mask pattern to perform an exposure;

step h: repeating the above step g until completing exposures for n times successively using the $(n+2)^{th}$ to $(2n+1)^{th}$ mask patterns to obtain the n fourth pattern regions on the array substrate, so that the data signal line in the third pattern region is connected with the data signal line in the adjacent fourth pattern region, and the data signal line in each fourth pattern region is connected with the data signal line in the adjacent fourth pattern region.

For example, the mask plate comprises a first mask pattern, a second mask pattern and a third mask pattern successively arranged, and the portions on both sides of the light-shielding pattern of the second mask pattern are asymmetric. For example, the method includes:

a first exposure process: shielding the second mask pattern and the third mask pattern and using the first mask pattern to perform an exposure to obtain the first pattern region on the array substrate;

a second exposure process: moving the mask plate, shielding the first mask pattern and the third mask pattern and using the second mask pattern to perform an exposure to obtain the second pattern region on the array substrate, so that the data signal line in the second pattern region is connected with the data signal line in the first pattern region;

a third exposure process: moving the mask plate, shielding the first mask pattern and the third mask pattern and using the second mask pattern again to perform an exposure to obtain the third pattern region on the array substrate, so that the data signal line in the second pattern region is disconnected with the data signal line in the third pattern region;

a fourth exposure process: moving the mask plate, shielding the first mask pattern and the second mask pattern and using the third mask pattern to perform an exposure to obtain the fourth pattern region on the array substrate, so that the data signal line in the third pattern region is connected with the data line in the fourth pattern region.

By using the above mask plate and fabrication method, a large-sized (for example, 110 inches) array substrate can be fabricated, and the data signal line can be disconnected in the middle of the array substrate. In this way, different data signals can be input simultaneously to two portions (i.e. the two display regions that are formed after the data signal line is disconnected) of the liquid crystal display panel comprising the array substrate, so that the effect of doubling the image scanning frame rate if the pixel charging time is kept constant or the effect of doubling the pixel charging time if the image scanning frame rate is kept constant can be obtained. Therefore, the liquid crystal display panel with the ultra-high resolution can be achieved and the problem that the pixel charging rate in the high-frame-rate liquid crystal display panel is relatively low can be solved.

Hereinafter, taking a mask plate comprising three mask patterns as an example, a further description is made for the mask plate, the method for fabricating the array substrate using the mask plate and the array substrate according to the embodiments of the invention.

In the following description, as an example, data signal lines are provided along a horizontal direction, and only the $m^{th}$ data signal line $D_m$, the $o^{th}$ data signal line $D_o$ and the $u^{th}$ data signal line $D_u$ are shown for simplicity.

In the fabrication process of the array substrate, the size of the mask plate is generally much smaller than the size of the base substrate (for example, it is made of glass) of the array substrate. Thus, stitching exposure is adopted in order to form the array pattern larger than the mask plate. The principle of the stitching exposure is as follows: the large array pattern is divided into several smaller portions, some of these smaller portions are selected to form the patterns of the mask plate, and then the stitching exposure is adopted to restore the large array pattern. During the stitching exposure, certain patterns of the mask plate may be repeatedly used to form the large array pattern.

Figure 2:
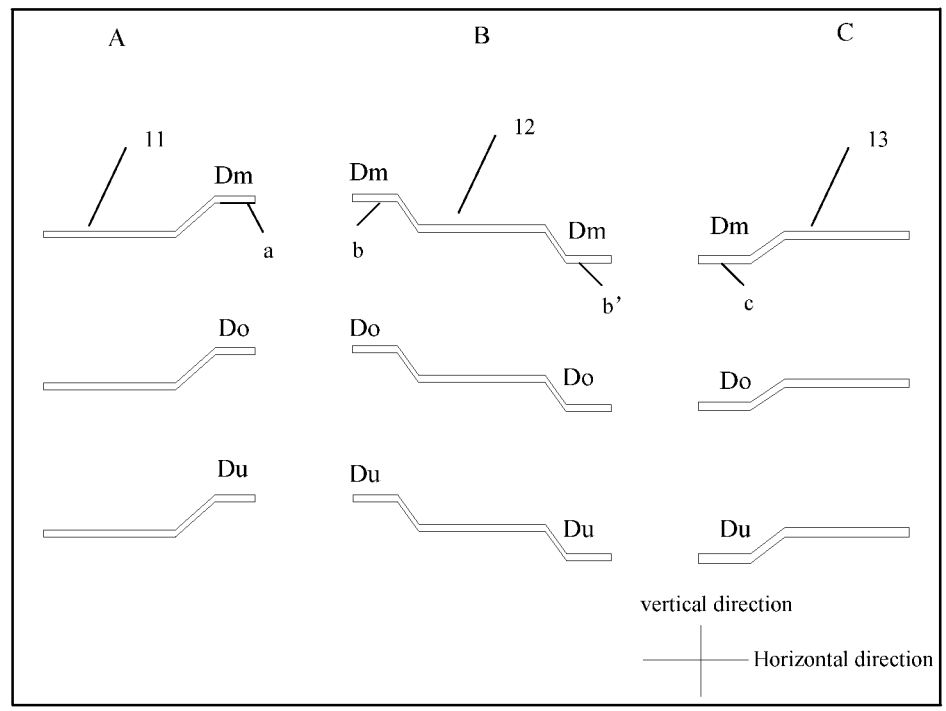
FIG. 2 is a schematic diagram illustrating a mask plate according to an embodiment of the invention.

FIG. 2 is a schematic diagram illustrating the mask plate according to an embodiment of the invention. For example, the mask plate is used to fabricate data signal lines on the array substrate. Based on the aforesaid principle of the stitching exposure, during designing the mask plate according to the embodiment of the invention, the pattern of data signal lines on the array substrate is segmented into four portions A, B, B' and C in which the portions B and B' located in the middle are of exactly the same pattern, and the three portions A, B and C different from one another are selected to form patterns in the mask plate. That is to say, in the example shown in FIG. 2, the mask plate comprises three patterns of A, B and C. As shown in FIG. 2 of the application, the mask plate comprises a first mask pattern A, a second mask pattern B and a third mask pattern C successively arranged in a horizontal direction and parallel to each other, the first mask pattern A comprises a first light-shielding pattern 11, the second mask pattern B comprises a second light-shielding pattern 12, the third mask pattern C comprises a third light-shielding pattern 13, the first light-shielding pattern 11, the second light-shielding pattern 12 and the third light-shielding pattern 13 are disconnected from each other, and portions on both sides of the second light-shielding pattern 12 are asymmetric.

Further referring to FIG. 2, the pattern A has a stitching exposure portion a on its right side, the pattern B has stitching exposure portions b and b' on its left and right sides respectively, and the pattern C has a stitching exposure portion c on its left side.

Figure 3:
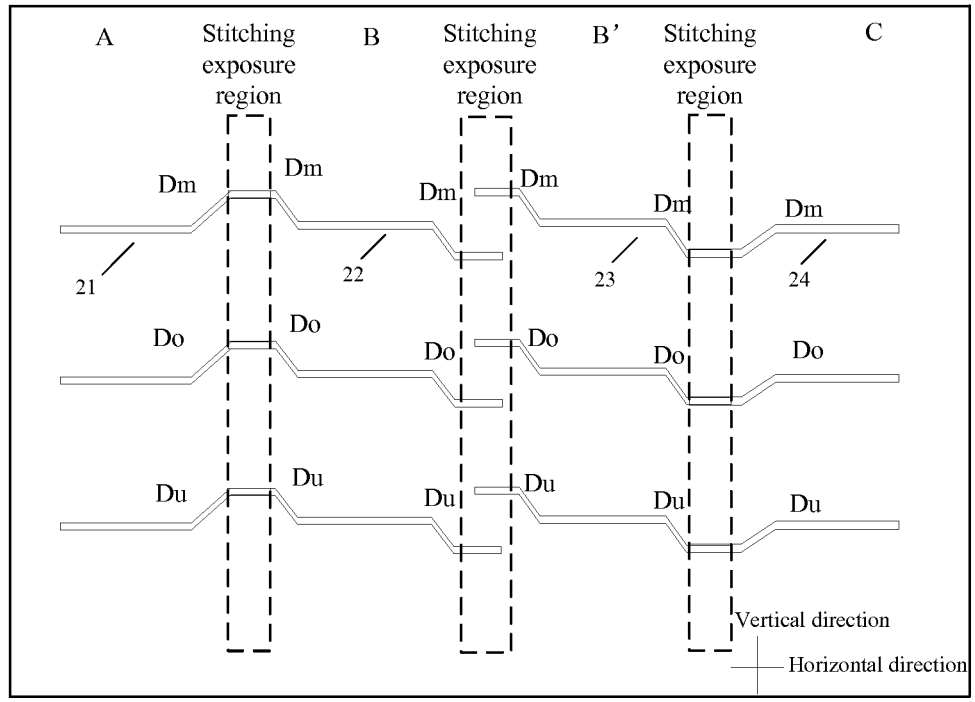
FIG. 3 is a schematic diagram illustrating a photoresist pattern after a stitching exposure according to the embodiment of the invention.
Figure 4:
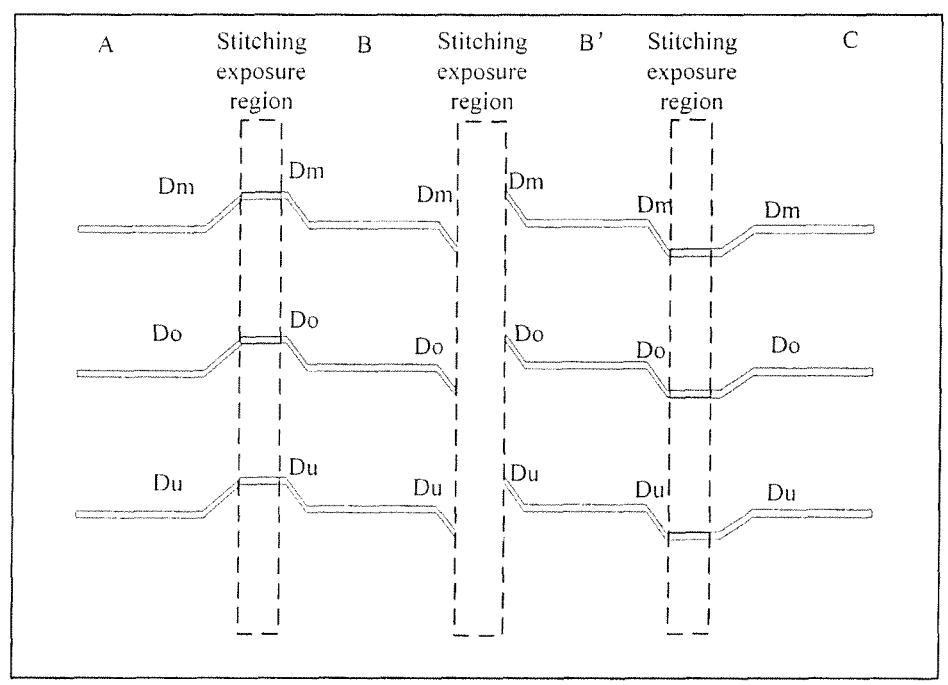
FIG. 4 is a schematic diagram illustrating data signal lines according to the embodiment of the invention.

In order to restore the large array pattern by the stitching exposure and to realize that the data signal lines are disconnected in the middle of the array substrate, the three patterns A, B and C should be specially designed. The stitching exposure portion a on the right side of the pattern A, stitching exposure portions b and b' on the left and right sides of the pattern B, and the stitching exposure portion c on the left side of the pattern C may be designed as shown in FIG. 2. It can be seen from FIG. 2 that the stitching exposure portions b and b' on the left and right sides of the pattern B are asymmetric with respect to the vertical direction of the pattern B. FIG. 3 is a schematic diagram illustrating the photoresist pattern after the stitching exposure. FIG. 4 is a schematic diagram illustrating the data signal lines finally formed on the based substrate. As shown in FIG. 3 and FIG. 4, if the photoresist is exposed using the pattern A, the portion A on the array substrate is formed; if the photoresist is exposed twice using the pattern B, the portions B and B' on the array substrate are formed respectively; if the photoresist is exposed using the pattern C, the portion C on the array substrate is formed. By using the mask plate shown in FIG. 2, it can be obtained that data signal lines of the portions A and B are connected with each other, data signal lines of the portions B' and C are also connected with each other but data signal lines of the portions B and B' are disconnected with each other. As shown in FIG. 3, the second photoresist pattern 22 has a first portion on a side of the second photoresist pattern 22 close to the third photoresist pattern 23; the third photoresist pattern 23 has a second portion on a side of the third photoresist pattern 23 close to the second photoresist pattern 22; the first portion and the second portion are provided in a stitching exposure region (i.e. the middle stitching exposure region in FIG. 3); in the stitching exposure region, the first portion and the second portion are separated from each other in a vertical direction, and the vertical direction is perpendicular to the horizontal direction; and in the stitching exposure region, a projection of the first portion on the horizontal direction is overlapped with a projection of the second portion on the horizontal direction.

It should be noted that, the patterns A, B and C of the mask plate may be appropriately modified, as long as it can be ensured that data signal lines of the portions A and B are connected with each other, data signal lines of the portions B' and C are also connected with each other but data signal lines of the portions B and B' are disconnected with each other during forming the array pattern by the stitching exposure.

During fabricating the array substrate, a metal layer for forming data signal lines is deposited on the base substrate, a photoresist is coated on the metal layer, and then the photoresist is exposed using the mask plate shown in FIG. 2. During a first exposure, the patterns B and C are shielded and the pattern A is used for exposure to obtain the portion A on the array substrate. During a second exposure, the mask plate is moved so that the stitching exposure portion b on the left side of the pattern B is located in the stitching exposure region between the portion A and the portion B to be formed, the patterns A and C are shielded and the pattern B is used for exposure to obtain the portion B on the array substrate. During a third exposure, the mask plate is moved so that the stitching exposure portion b' on the right side of the pattern B is located in the stitching exposure region between the portion B and the portion C to be formed, the patterns A and C are shielded and the pattern B is used for exposure to obtain the portion B' on the array substrate. During a fourth exposure, the mask plate is moved so that the stitching exposure portion c on the left side of the pattern C is located in the stitching exposure region between the portion B and the portion C to be formed, the patterns A and B are shielded and the pattern C is used for exposure to obtain the portion C on the array substrate. It can be seen that both the second exposure and the third exposure use the pattern B. Referring to FIG. 3 and FIG. 4, in the stitching exposure region between the portions A and B, the stitching exposure portion a on the right side of the pattern A adopted for the first exposure completely overlaps the stitching exposure portion b on the lest side of the pattern B adopted for the second exposure, the photoresist in this overlapping region is not exposed, the metal layer in this overlapping region is retained after the subsequent developing and etching processes, and thus connection of the data signal lines of the portions A and B is realized. In the stitching exposure region between the portions B and B', the stitching exposure portion b' on the right side of the pattern B adopted for the second exposure does not overlap the stitching exposure portion b on the left side of the pattern B adopted for the third exposure as the stitching exposure portions b and b' on the lest and right sides of the pattern B are asymmetric with respect to the vertical direction of the pattern B, in this case, the photoresist in the stitching exposure region between the portions B and B' are all exposed after the second exposure and the third exposure, such that the data signal lines of the portions B and B' are disconnected after the subsequent developing and etching processes. In the stitching exposure region between the portions B' and C, the stitching exposure portion b' on the right side of the pattern B adopted for the third exposure completely overlaps the stitching exposure portion c on the left side of the pattern C adopted for the fourth exposure, the photoresist in this overlapping region is not exposed, the metal layer in this overlapping region is retained after the subsequent developing and etching processes, and thus connection of the data signal lines of portions B' and C is realized.

Further, as an appropriate modification of the embodiment of the invention, the stitching exposure may be performed by only using the patterns A and C of the mask plate shown in FIG. 2. During a first exposure, the patterns B and C are shielded and the pattern A is used for exposure to obtain the portion A on the array substrate. During a second exposure, the mask plate is moved so that the stitching exposure portion c on the left side of the pattern C is located in the stitching exposure region between the portion A and the portion C to be formed, the patterns A and B are shielded and the pattern C is used for exposure to obtain the portion C on the array substrate. On the array substrate obtained in such a way, in the stitching exposure region between the portions A and C, the stitching exposure portion a on the right side of the pattern A adopted for the first exposure does not overlap the stitching exposure portion c on the left side of the pattern C adopted for the second exposure, in this case, the photoresist in the stitching exposure region between the portions A and C are all exposed after the first exposure and the second exposure, such that the data signal lines of the portions A and C are disconnected (that is, the data signal lines in the middle of the array substrate are disconnected) after the subsequent developing and etching processes.

The data signal lines of the conventional array substrate are continuous, such that the liquid crystal display panel comprising the conventional array substrate can only input one data signal at one time, resulting in a lower image scanning frame rate if the pixel charging time is kept constant, or a shorter pixel charging time if the image scanning frame rate is kept constant. In the embodiments of the invention, the array pattern is segmented, and the data signal lines at the segmentation position (i.e. at the stitching exposure region during restoring the array pattern) are designed, so that the data signal lines are disconnected in the middle of the array substrate. In this way, different data signals can be input simultaneously to two portions (i.e. the two display regions that are formed after the data signal lines are disconnected) of the liquid crystal display panel comprising the array substrate, so that the effect of doubling the image scanning frame rate if the pixel charging time is kept constant or the effect of doubling the pixel charging time if the image scanning frame rate is kept constant can be obtained. Therefore, the liquid crystal display panel with the ultra-high resolution can be achieved and the problem that the pixel charging rate in the high-frame-rate liquid crystal display panel is relatively low can be solved.

For example, the array substrate according to the embodiments of the invention may be applied to any products or components having the display function, such as liquid crystal display panel, electronic paper, OLED display panel, PLED display panel, mobile phone, tablet computer, television, monitor, note-book computer, digital photo frame, navigator etc.

The foregoing embodiments merely are exemplary embodiments of the invention, and not intended to define the scope of the invention. The scope of the invention is determined by the appended claims.

What is claimed is:

1. A method for fabricating a data signal line using a mask plate,
    wherein the mask plate comprises a first mask pattern, a second mask pattern and a third mask pattern successively arranged in a horizontal direction and parallel to each other, the first mask pattern comprises a first light-shielding pattern, the second mask pattern comprises a second light-shielding pattern, the third mask pattern comprises a third light-shielding pattern, the first light-shielding pattern, the second light-shielding pattern and the third light-shielding pattern are disconnected from each other, and portions on both sides of the second light-shielding pattern are asymmetric;
    wherein the method comprises:
    providing a metal layer for forming a data signal line on a base substrate;
    coating a photoresist on the metal layer;
    performing exposure processes on the photoresist by using the mask plate;
    performing a developing process on the photoresist; and
    performing an etching process on the metal layer to form the data signal line; and
    wherein the method comprises:
    a first exposure process: shielding the second mask pattern and the third mask pattern and using the first mask pattern to perform the first exposure process on the photoresist to obtain a first photoresist pattern corresponding to the first light-shielding pattern of the first mask pattern;
    a second exposure process: moving the mask plate along the horizontal direction, shielding the first mask pattern and the third mask pattern and using the second mask pattern to perform the second exposure process on the photoresist to obtain a second photoresist pattern corresponding to the second light-shielding pattern of the second mask pattern, the second photoresist pattern is partially overlapped with the first photoresist pattern;
    a third exposure process: moving the mask plate along the horizontal direction, shielding the first mask pattern and the third mask pattern and using the second mask pattern again to perform the third exposure process on the photoresist to obtain a third photoresist pattern corresponding to the second light-shielding pattern of the second mask pattern, the third photoresist pattern is not overlapped with the second photoresist pattern; and
    a fourth exposure process: moving the mask plate along the horizontal direction, shielding the first mask pattern and the second mask pattern and using the third mask pattern to perform the fourth exposure process on the photoresist to obtain a fourth photoresist pattern corresponding to the third light-shielding pattern of the third mask pattern, the fourth photoresist pattern is partially overlapped with the third photoresist pattern.

2. The method for fabricating the data signal line using the mask plate according to claim 1, wherein
    the second photoresist pattern has a first portion on a side of the second photoresist pattern close to the third photoresist pattern;
    the third photoresist pattern has a second portion on a side of the third photoresist pattern close to the second photoresist pattern;
    the first portion and the second portion are provided in a stitching exposure region;
    in the stitching exposure region, the first portion and the second portion are separated from each other in a vertical direction, and the vertical direction is perpendicular to the horizontal direction; and
    in the stitching exposure region, a projection of the first portion on the horizontal direction is overlapped with a projection of the second portion on the horizontal direction.

3. The method for fabricating the data signal line using the mask plate according to claim 2, wherein
    during the developing process, the first photoresist pattern is retained, the second photoresist pattern except the first portion is retained, the third photoresist pattern except the second portion is retained, and the fourth photoresist pattern is retained.

4. The method for fabricating the data signal line using the mask plate according to claim 3, wherein the data signal line is disconnected in the stitching exposure region.

5. The method for fabricating the data signal line using the mask plate according to claim 1, wherein
    the portions on both sides of the second light-shielding pattern are asymmetric with respect to a vertical direction, and the vertical direction is perpendicular to the horizontal direction.

6. The method for fabricating the data signal line using the mask plate according to claim 1, wherein a side of the second light-shielding pattern close to the first light-shielding pattern and a side of the first light-shielding pattern close to the second light-shielding pattern are symmetric with each other with respect to a vertical direction, and the vertical direction is perpendicular to the horizontal direction.

7. The method for fabricating the data signal line using the mask plate according to claim 1, wherein a side of the second light-shielding pattern close to the third light-shielding pattern and a side of the third light-shielding pattern close to the second light-shielding pattern are symmetric with each other with respect to a vertical direction, and the vertical direction is perpendicular to the horizontal direction.

8. The method for fabricating the data signal line using the mask plate according to claim 1, wherein during the first exposure process, the second exposure process, the third exposure process and the fourth process, the mask plate is not moved along a vertical direction, and the vertical direction is perpendicular to the horizontal direction.

* * * * *